US010958235B2

(12) United States Patent
Kaajakari

(10) Patent No.: US 10,958,235 B2
(45) Date of Patent: Mar. 23, 2021

(54) THICKNESS MODE RESONATOR

(71) Applicant: Murata Manufacturing Co., Ltd., Nagaokakyo (JP)

(72) Inventor: Ville Kaajakari, Helsinki (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/546,606

(22) Filed: Aug. 21, 2019

(65) Prior Publication Data

US 2021/0058054 A1    Feb. 25, 2021

(51) Int. Cl.
*H03H 9/02* (2006.01)
*H03H 9/54* (2006.01)
*H03H 9/17* (2006.01)

(52) U.S. Cl.
CPC .......... *H03H 9/02007* (2013.01); *H03H 9/17* (2013.01); *H03H 9/54* (2013.01)

(58) Field of Classification Search
CPC .......... H03H 9/02007; H03H 9/17; H03H 9/54
See application file for complete search history.

(56) References Cited

U.S. PATENT DOCUMENTS

| 9,905,748 | B2* | 2/2018 | Nishimura | ........... H03H 9/0595 |
| 2005/0093397 | A1 | 5/2005 | Yamada et al. | |
| 2005/0110598 | A1* | 5/2005 | Larson, III | ............. H03H 9/584 333/191 |
| 2014/0159548 | A1 | 6/2014 | Burak et al. | |
| 2018/0226937 | A1 | 8/2018 | Umeda et al. | |
| 2020/0259480 | A1* | 8/2020 | Pensala | ................... H03H 9/17 |

* cited by examiner

*Primary Examiner* — Samuel S Outten
(74) *Attorney, Agent, or Firm* — Arent Fox LLP

(57) ABSTRACT

A resonator that includes a substrate with a cavity that extends in a principal surface thereof and a vibrating resonator above the principal surface of the substrate and including bottom and top electrodes with a piezoelectric layer disposed therebetween. Moreover, a silicon dioxide layer is provided above the substrate and below the vibrating resonator to cover the cavity of the substrate, and a silicon layer is provided between the silicon dioxide layer and the vibrating resonator. The bottom electrode, the top electrode and the piezoelectric layer of the vibrating resonator each have a thickness configured to accommodate substantially a half wavelength $\lambda/2$ of the resonator, and the silicon layer has a thickness that accommodates substantially multiple of the half wavelength $\lambda/2$ of the resonator.

18 Claims, 9 Drawing Sheets

THICKNESS MODE RESONATOR

TECHNICAL FIELD

The current application relates to a high performance resonator, and, more particularly, to a thickness mode overtone resonator.

BACKGROUND

High speed communication systems require high performance resonators with good stability and quality factor. Currently, these resonators can be provided as quartz crystal resonators that typically operate at frequencies between 10 MHz and 100 MHz. Moreover, for digital networks such as an Ethernet network, surface acoustic wave ("SAW") resonators that operate at frequencies above 100 MHz can also be used, but these resonator are relatively large and expensive. It is anticipated that future communication systems and technologies will increase the requirements for using frequencies higher than 100 MHz. Accordingly, there is a growing need for high frequency resonators that are small and have good performance.

One type of resonator that can be used as a filter at frequencies over 1 GHz is a thin film bulk acoustic resonators ("FBAR"). For example, FIG. 1 illustrates an exemplary conventional air gap type FBAR. As shown, FIG. 1 illustrates a cross-sectional view in the thickness direction of an air gap type FBAR 10 that is formed from a silicon substrate 12 having a cavity 14 (i.e., an air gap) extending in the center portion of the silicon substrate 12. Moreover, the vibrating resonator is composes of a bottom electrode 16, a piezoelectric layer 18, and a top electrode 20. As further shown, reference 22 illustrates the vibrating mode shape, in which the vibration of the air gap type FBAR 10 is mainly in the thickness mode. In this design, the resonator thickness equals half wavelength. In addition, for such a conventional design, the piezoelectric layer 18 is typically formed from aluminum nitride (AlN), while the bottom and top electrodes 16 and 20 can be formed by a metal such as molybdenum, aluminum, tungsten, platinum or the like.

Another type of conventional resonator is a solidly mounted resonator ("SMR"). For example, FIG. 2 illustrates an exemplary conventional SMR 30 that is also formed from a silicon substrate 32 and includes a bottom electrode 34, a piezoelectric layer 36, and a top electrode 38. Similar to the FBAR 10 shown in FIG. 1, reference 40 illustrates the vibrating mode shape of the SMR 30, in which the vibration is again mainly in the thickness mode and the resonator thickness equals half wavelength. However, unlike FBAR 10, the SMR 30 shown in FIG. 2 does not have an air cavity under the vibrating bottom electrode 34. Instead, the resonator 30 includes an acoustic reflector 42 formed on the silicon substrate 32. The reflector 42 is provided to minimize the energy leakage from the resonator 30 into the silicon substrate 32, thereby eliminating the need for an air cavity under the resonator 40.

While the FBAR 10 has good characteristics for filter applications, such conventional designs are less suited for making oscillators. In particular, the resonating frequency is high (over 1 GHz), but the quality factor is low (e.g., between 1,000 and 2,000). In addition, FBAR resonators have temperature coefficient of frequency ("TCF") that is significantly larger than for quartz resonators. Accordingly, there is a need for a small sized resonator with good temperature characteristics.

SUMMARY OF THE INVENTION

The exemplary embodiments of the present invention provide a resonator that enables high performance and that is small in size and therefore suitable for high frequency oscillator applications required for high-speed communication systems.

Thus, according to an exemplary embodiment, a resonator is provided for vibrating in a thickness direction. In this aspect, the resonator includes a substrate having a cavity extending in a principal surface thereof; a piezoelectric film stack disposed above the principal surface of the substrate and including bottom and top electrodes with a piezoelectric layer disposed therebetween, with the piezoelectric film stack comprising a thickness that substantially corresponds to a half wavelength $\lambda/2$ of the resonator; and a positive temperature coefficient stack that includes at least a silicon layer and that disposed between the substrate and the piezoelectric film stack to cover the cavity of the substrate, with the positive temperature coefficient stack comprising a thickness that substantially corresponds to a multiple of the half wavelength $\lambda/2$ of the resonator. Moreover, the piezoelectric film stack comprises a negative temperature coefficient, and the silicon layer is doped to configure the positive temperature coefficient stack to have a positive temperature coefficient, such that the positive temperature coefficient stack combined with the piezoelectric film stack configures the resonator as a zero temperature coefficient overtone resonator that vibrates in the thickness direction.

In another exemplary aspect, the positive temperature coefficient stack further comprises at least one silicon dioxide layer disposed between the silicon layer and the piezoelectric film stack.

In another exemplary aspect, the piezoelectric film stack further comprises at least one silicon dioxide layer disposed between the bottom and top electrode layers.

In another exemplary aspect, the silicon layer is doped with phosphorous to configure the positive temperature coefficient stack to have the positive temperature coefficient balanced with the negative temperature coefficient of the piezoelectric film stack. In a refinement of this aspect, a resistivity of the phosphorus doped silicon layer is equal to or less than 0.8 m$\Omega$·cm.

In another exemplary aspect, the cavity comprises a first width extending in a direction parallel to the principal surface of the cavity and the top electrode comprises a second width extending in the direction parallel to the principal surface of the cavity, with the second width being less than the first width. Moreover, in one aspect the second width of the top electrode is between 50 µm and 500 µm.

In another exemplary aspect, the resonator includes a plurality of etch trenches that extend through the bottom electrode and the piezoelectric layer of the piezoelectric film stack and through the positive temperature coefficient stack, such that the plurality of etch trenches extend to the cavity of the substrate. Moreover, in one aspect, the top electrode comprises a surface area such that the plurality of etch trenches are each disposed an equal distance from the top electrode. In another aspect, the top electrode comprises a surface area such that the plurality of etch trenches are each at distance between 10 to 100 µm from top electrode.

In another exemplary aspect, the thickness of the silicon layer comprises one of a wavelength of $\lambda/2$, $\lambda$, $3\lambda/2$ or $2\lambda$ of the resonator, such that the resonator is configured as a thickness mode overtone resonator.

In another exemplary aspect, the top electrode comprises a surface area that is 80% or less than a projection of a cavity area on which the top electrode is disposed. Moreover, in a refinement of this aspect, a distance between the top electrode and an edge of the cavity in a widthwise direction of the resonator is between 10 to 100 µm from top electrode.

In another exemplary aspect, the top electrode comprises a plurality of segmented top electrodes and the bottom electrode is grounded, such that the resonator is configured as a differential oscillator with at least two of the plurality of segmented top electrodes configuring adjacent areas of the differential oscillator to vibrate 180 degrees out of phase from one another.

According to another exemplary embodiment, a resonator is provided for vibrating in a thickness direction. In this aspect, the resonator includes a substrate having a cavity extending in a principal surface thereof; a piezoelectric resonator disposed above the principal surface of the substrate, with the piezoelectric resonator including bottom and top electrodes with a piezoelectric layer disposed therebetween; and a positive temperature coefficient resonator disposed between the substrate and the piezoelectric resonator to cover the cavity of the substrate, with positive temperature coefficient resonator including at least a silicon layer doped to configure the positive temperature coefficient resonator to have a positive temperature coefficient. Moreover, the cavity comprises a first width extending in a direction parallel to the principal surface of the cavity and the top electrode comprises a second width extending in the direction parallel to the principal surface of the cavity, with the second width being less than the first width.

In another exemplary aspect, the piezoelectric resonator comprises a negative temperature coefficient, and the silicon layer is doped with phosphorous to balance the positive temperature coefficient resonator with the piezoelectric resonator, such that the resonator is configured as a zero temperature coefficient overtone resonator that vibrates in the thickness direction. Yet further, in one aspect, the piezoelectric resonator comprises a thickness that substantially corresponds to a half wavelength $\lambda/2$ of the resonator; and the positive temperature coefficient resonator comprises a thickness that substantially corresponds to a multiple of the half wavelength $\lambda/2$ of the resonator. Moreover, in another exemplary aspect, the thickness of the silicon layer comprises one of a wavelength of $\lambda/2$, $\lambda$, $3\lambda/2$ or $2\lambda$ of the resonator, such that the resonator is configured as a thickness mode overtone resonator.

In another exemplary aspect, at least one silicon dioxide layer is disposed between at least the silicon layer and the piezoelectric resonator or between the bottom and top electrode layers.

In another exemplary aspect, the resonator includes a plurality of etch trenches that extend through the bottom electrode and the piezoelectric layer of the piezoelectric resonator and through the positive temperature coefficient resonator, such that the plurality of etch trenches extend to the cavity of the substrate.

The above simplified summary of example embodiments serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and particularly pointed out in the claims.

BRIEF DESCRIPTION OF THE DRAWINGS

The accompanying drawings, which are incorporated into and constitute a part of this specification, illustrate one or more example embodiments of the present disclosure and, together with the detailed description, serve to explain their principles and implementations. The drawings provided are for illustrative purposes only and are therefore not drawn to scale.

DETAILED DESCRIPTION

Example aspects are described herein in the context of a thickness mode overtone resonator that overcomes many of the technical disadvantages of existing devices described above. In particular, the exemplary embodiments disclosed herein provide a resonator that enables high performance and that is small in size and therefore suitable for high frequency oscillator applications required for high-speed communication systems.

Those of ordinary skill in the art will realize that the following description is illustrative only and is not intended to be in any way limiting. Other aspects will readily suggest themselves to those skilled in the art having the benefit of this disclosure. Reference will now be made in detail to implementations of the example aspects as illustrated in the accompanying drawings. The same reference indicators will be used to the extent possible throughout the drawings and the following description to refer to the same or like items.

Figure 1:
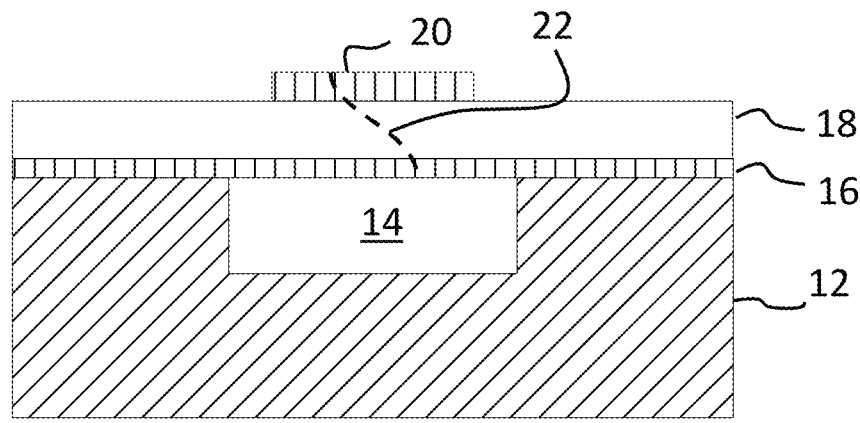
FIG. 1 illustrates a cross-sectional view of an exemplary conventional air gap type thin-film bulk acoustic resonators.
Figure 2:
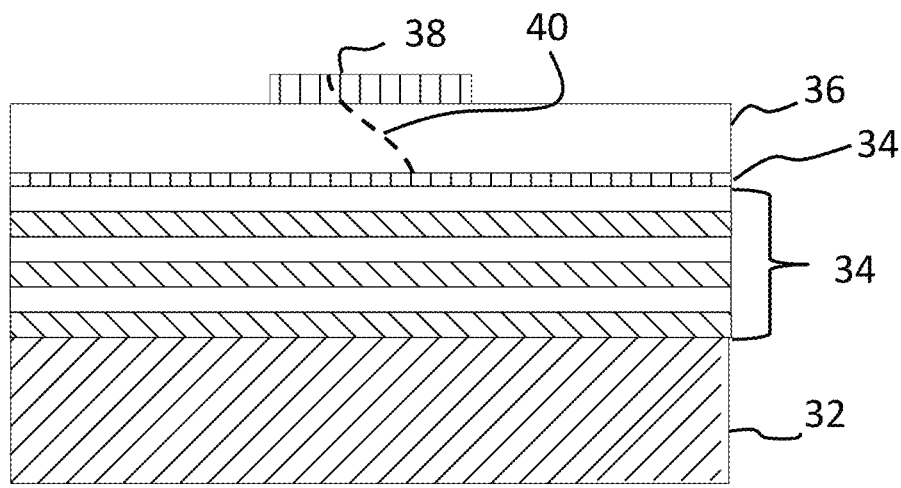
FIG. 2 illustrates a cross-sectional view of an exemplary conventional mounted resonator.
Figure 3:
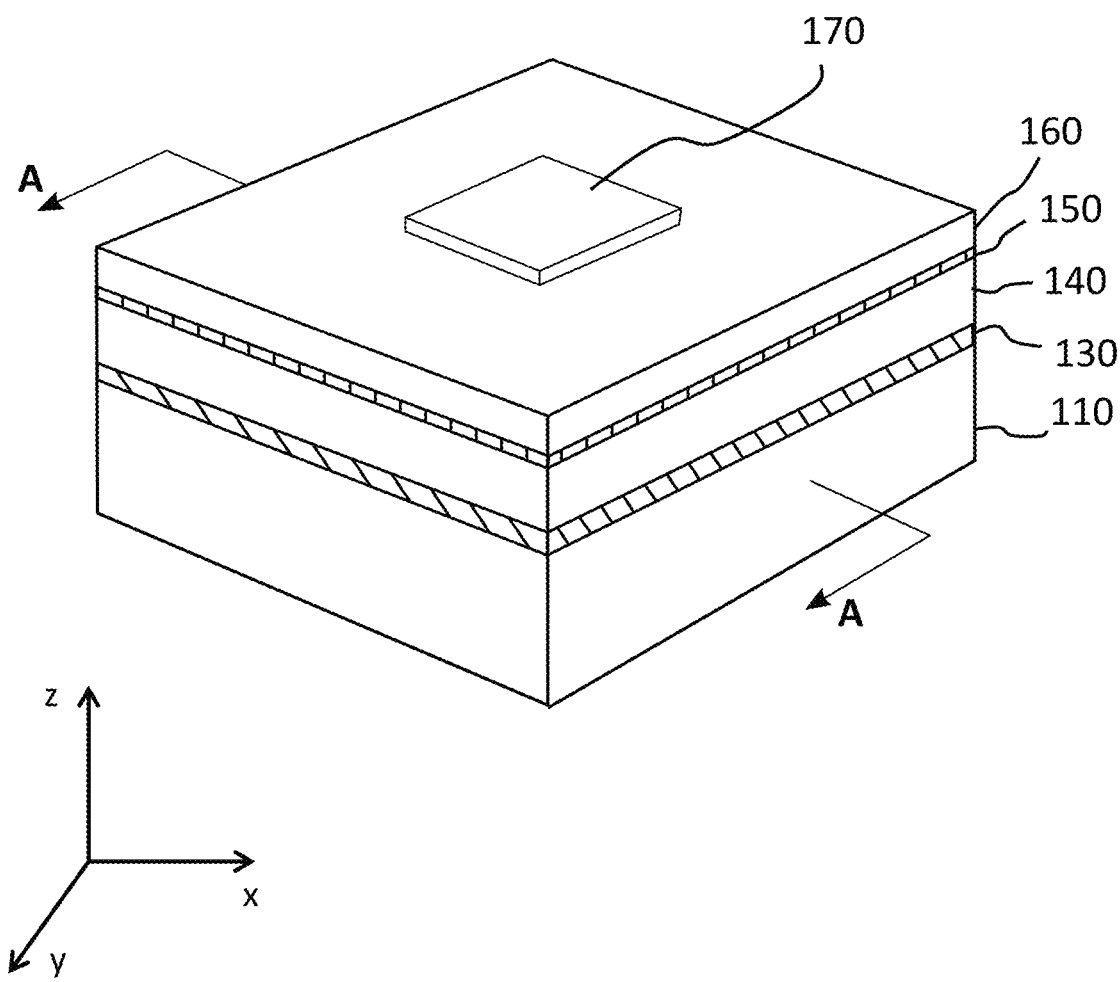
FIG. 3 illustrates a thickness mode overtone resonator according to a first exemplary embodiment.
Figure 4A:
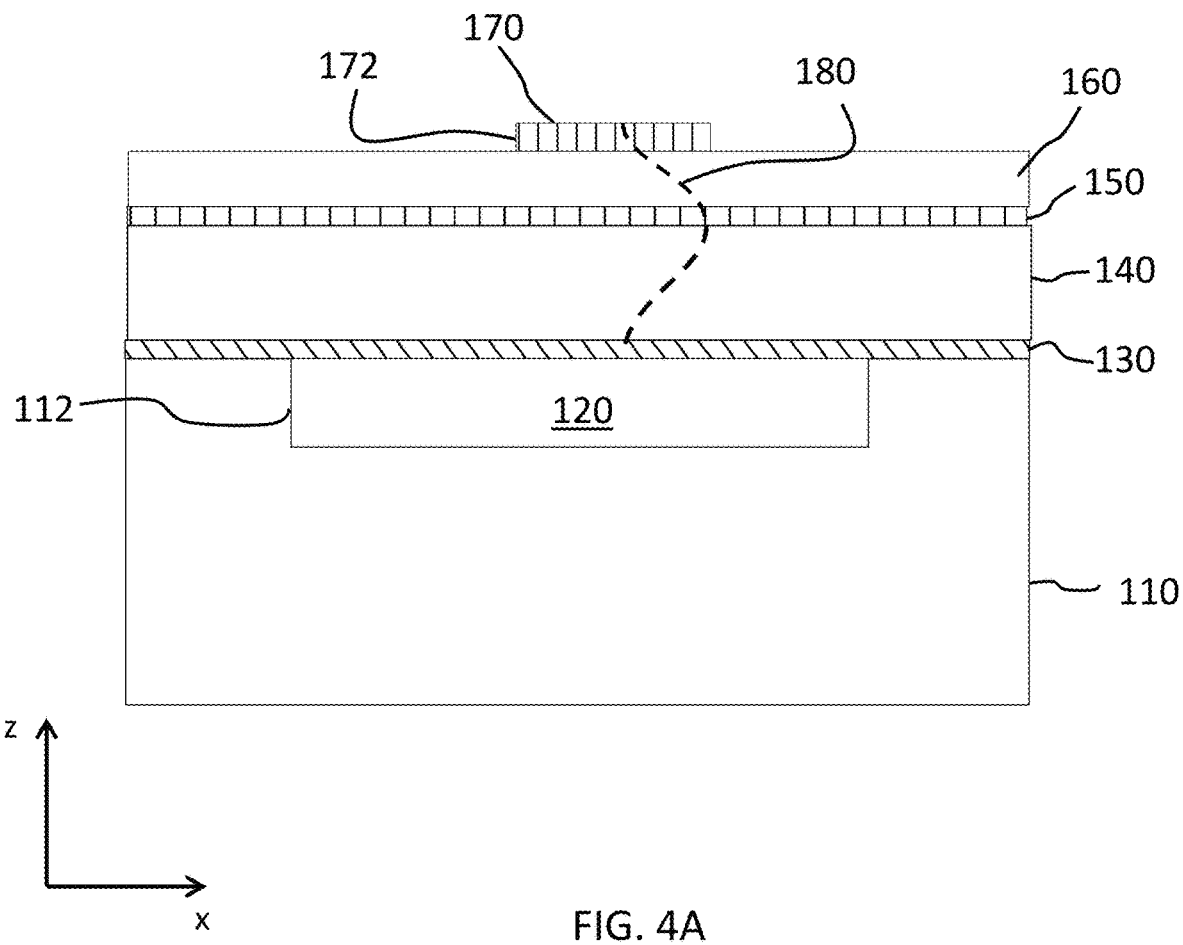
FIG. 4A illustrates a cross sectional view of the thickness mode overtone resonator taken along lines A-A as shown in FIG. 3 according to the first exemplary embodiment.

Accordingly, FIG. 3 illustrates a thickness mode overtone resonator 100 according to a first exemplary embodiment. FIG. 4A illustrates a cross sectional view of the thickness mode overtone resonator 100 taken along lines A-A as shown in FIG. 3.

As shown according to the first exemplary embodiment, the thickness mode overtone resonator 100 can be formed on a silicon substrate 110 with a cavity 120 formed therein. In this aspect, the cavity 120 is formed in a center portion or section of a principal main surface of the silicon substrate 110 (i.e., parallel to the X and Y axes), such that side edges 112 extending in the thickness direction from the sides of the silicon substrate 110 effectively define the cavity 120. It should be appreciated that the cavity 120 can be formed in the silicon layer 110 using any conventional technique, such as etching.

As further shown, a silicon dioxide layer 130 is formed on top of the silicon substrate 110 and, more particularly, on the sides 112 of the silicon substrate 110 to effectively cover and seal the cavity 120, defining an air gap therein. In an exemplary embodiment, the silicon dioxide layer 130 comprises a thickness ranging from 100 nm to 2 μm. Moreover, a single crystal silicon layer 140 is formed on top of (and disposed thereon) the silicon dioxide layer 130, such that the silicon dioxide layer 130 is formed between the single crystal silicon layer 140 and the silicon substrate 110. Collectively, the single crystal silicon layer 140 and the silicon dioxide layer 130 form a positive temperature coefficient stack, also referred to as a positive temperature coefficient resonator, which is discussed in greater detail below. Moreover, according to an exemplary aspect, the single crystal silicon layer 140 can have a thickness that ranges from 2 μm to 50 μm.

As further shown, a metal bottom electrode 150, a piezoelectric layer 160, and a top electrode 170, are provided to form a piezoelectric film stack (also referred to as a piezoelectric resonator) on the single crystal silicon layer 140. In one exemplary aspect, the piezoelectric layer 160 can be formed from aluminum nitride (AlN) and have a thickness in the range from 0.4 μm to 3 μm. In addition, the bottom and top electrode 150 and 170 are typically a metal, such as molybdenum, with thickness ranging from 0.1 μm to 1 μm.

According to the exemplary embodiment shown in FIGS. 3 and 4A, the thickness mode overtone resonator 100 is configured to vibrate in the thickness mode (i.e., in the Z axes or vertical direction). In other words, the vibration mode is illustrated by the dotted line 180. The vibration mode extends through piezoelectric film stack into silicon layer 140. At the resonance frequency, the mode shape is a multiple of half wavelengths. It is noted that there are many possible choices for piezoelectric film stack thickness and silicon thickness that accommodate multiple half wavelengths in the thickness direction according to variations of the exemplary embodiment. For timing applications, it is preferable to maximize the electromechanical coupling which results in smallest electrical impedance and highest electrical resonator current. The optimum coupling is achieved when the thickness of piezoelectric film stack (including metal electrodes 150 and 170 and the piezoelectric thin film 160) is configured to substantially accommodate a half wavelength $\lambda/2$ at the resonance frequency of the resonator 100. With this design configuration, the single-crystal silicon layer 140 comprises a thickness that is configured to accommodate a multiple of half wavelengths $\lambda$. For example, the thickness of the single-crystal silicon layer 140 can be selected as $\lambda/2$, $\lambda$, $3\lambda/2$ or $2\lambda$, for example. Based on these configurations, the overtone resonator 100 is configured as a thickness mode overtone resonator with a high quality factor. It is noted that the term "substantially" as recited herein is provided to account for minor variations in the thickness of each layer that may occur during manufacturing as would be appreciated to one skilled in the art.

In one exemplary aspect, a thickness overtone resonator 100 is provided having a configuration as shown in FIGS. 3 and 4A, in which the silicon layer 140 has thickness of 6 μm, the bottom electrode 150 has thickness of 0.2 μm, the piezoelectric layer 160 formed from aluminum nitride has a thickness of 1.2 μm, and the top electrode 170 has a thickness of 0.6 μm. In accordance with the exemplary overtone resonator 100 having these dimensions, the overtone resonator 100 will be configured to operate with a resonance frequency of approximately about 1.3 GHz. Accordingly, these dimensions accommodate approximately two one half wavelengths in silicon and one half wavelength on layers above the silicon layer 140 (i.e., the bottom electrode 150, top electrode 170, and the aluminum nitride layer 160).

In accordance with another exemplary aspect, another thickness overtone resonator 100 is provided having a configuration as shown in FIGS. 3 and 4A, in which the silicon layer 140 has a thickness of 5 μm, the bottom electrode 150 has thickness of 0.4 μm, the piezoelectric layer 160 is formed of aluminum nitride and has a thickness of 2.2 μm, and the top electrode 170 has a thickness of 1 μm. In accordance with the exemplary overtone resonator 100 having these dimensions, the exemplary overtone resonator 100 will be configured to operate with a resonance frequency of approximately about 800 MHz. Accordingly, these dimensions accommodate approximately two one half wavelengths in silicon and one half wavelength on layers above the silicon layer 140 (i.e., bottom electrode 150, the top electrode 170, and the aluminum nitride layer 160).

Figure 4B:
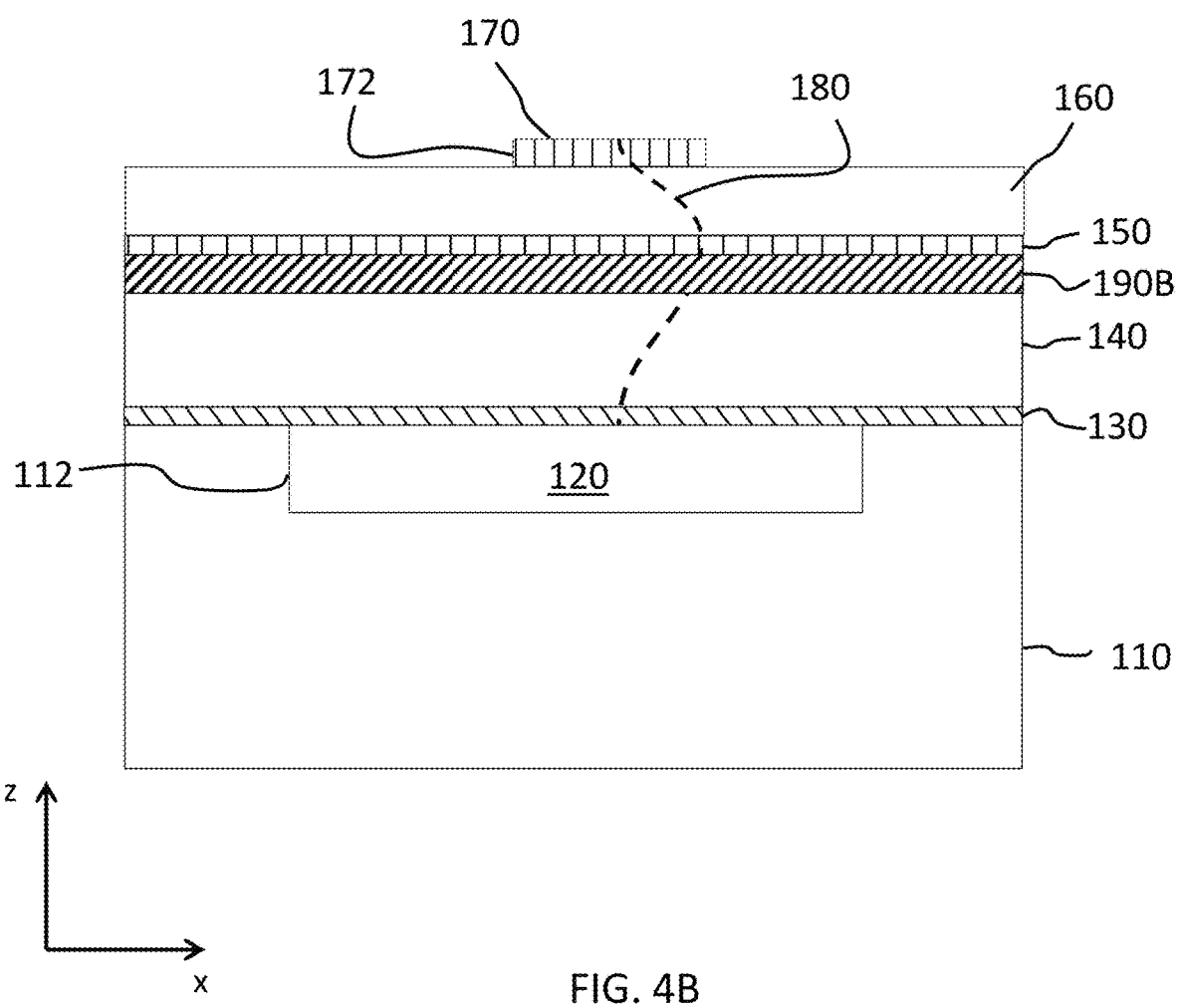
FIG. 4B illustrates a refinement of the exemplary embodiment of the thickness mode overtone resonator as shown in FIG. 4A.
Figure 4C:
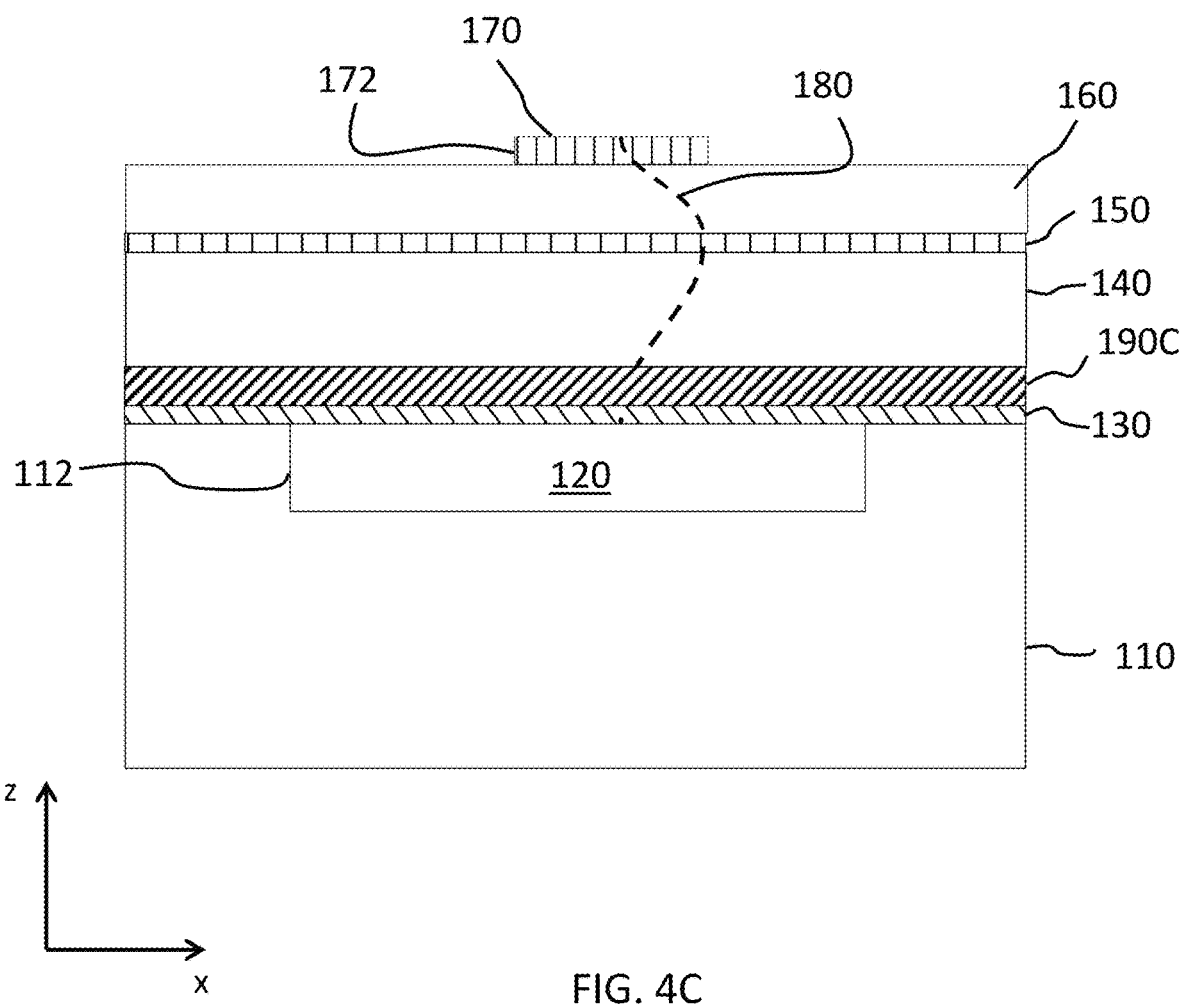
FIG. 4C illustrates a refinement of the exemplary embodiment of the thickness mode overtone resonator as shown in FIG. 4A.

According to the exemplary embodiment, the piezoelectric film stack formed by piezoelectric layer 160 and metal electrodes 150 and 170 has negative temperature coefficient of frequency. In other words, the resonant frequency decreases with temperature. This technical effect is highly undesirable in time keeping applications. Thus, in the exemplary embodiment, the negative temperature coefficient of frequency can be reduced by incorporating silicon dioxide between bottom electrode 150 and the top electrode 170 as is shown in FIG. 4C (discussed below). While this approach reduces temperature coefficient, the resulting resonator typically has relative large second order temperature coefficient that results is over 50 ppm frequency drift over typical temperature range of −40° C. to 85° C.

In a refinement of the exemplary aspect, when the thickness overtone resonator 100 is configured for time keeping applications, the single-crystal silicon layer 140 can be temperature compensated by doping it with phosphorus. In a preferred aspect of the exemplary embodiment, the temperature coefficient of silicon is made positive by doping the silicon with the phosphorus doping density of over $5\cdot10^{19}$ l/cm$^3$. Moreover, in a refinement of the exemplary aspect, the resistivity of the phosphorus doped silicon can be equal to or less than 0.8 mΩ·cm.

Advantageously, the slightly positive first order temperature coefficient of silicon will balance negative temperature coefficients of the metal electrodes 150 and 170 and the piezoelectric layer 160. Using silicon 140 as a compensating material for reduced temperature dependency is an advantage when the thickness overtone resonator 100 is implemented in applications that require good temperature stability. In applications that require exceptional frequency stability, the phosphorus doping can be increase to less than 0.65 mΩ·cm which also minimizes the second order temperature coefficient of the resonator. However, very high doping concentrations are known decrease the magnitude of the positive temperature coefficient of phosphorus doped silicon. It is possible that silicon doped with very high doping concentration cannot compensate the negative temperature dependency of the piezoelectric film stack.

In further refinements of the exemplary embodiment, one or more additional layers of silicon dioxide can be provided to make the first order temperature coefficient more positive. This enables the use of higher doping concentrations to minimize the second order temperature dependency. For example, in one aspect as show in FIG. 4B, an additional layer of silicon dioxide 190B can be incorporated between the single-crystal silicon layer 140 and the bottom electrode 150. In another exemplary aspect as shown in FIG. 4C, the additional layer of silicon dioxide 190C is below single crystal silicon 140. In this exemplary aspect, the single crystal silicon 140 and silicon dioxide layer 130 or layers 130 and 190B and/or 190C form a temperature compensation stack with a positive temperature dependency that compensates the temperature dependency of piezoelectric film stack (i.e., electrodes 150 and 170 and piezoelectric layer 160). Moreover, the thickness of this temperature compensation stack layer is configured so that the stack accommodates a multiple of half wavelengths λ, at the resonance frequency. By combining these the temperature compensation stack (i.e., the single crystal silicon layer with silicon dioxide layer(s)) and piezoelectric film stack (i.e., the top and bottom electrodes and piezoelectric layer), a total frequency variation of less than 50 ppm over temperature range of −40° C. to 85° C. can be achieved.

According to the exemplary embodiment, an additional advantage of using the overtone resonator 100 with one or multiple half wavelengths in silicon is that the thickness of the single-crystal silicon layer 140 can be increased without changing the resonant frequency to adjust electrical and mechanical properties of the resonator. For example, in the second example described above, the thickness of the single-crystal silicon layer 140 can be multiple of half-wavelengths with possible thicknesses of 5 μm, 10 μm, 15 μm, and the like. By increasing the thickness of the single-crystal silicon layer 140, the resonator 100 becomes mechanically more robust, as would be appreciated to one skilled in the art. Moreover, by increasing the silicon thickness, the temperature characteristics of silicon have a larger role in determining the temperature coefficient of frequency of the whole resonator 100. Since the temperature dependency of silicon can be adjusted and controlled accurately, having large total silicon thickness in comparison to thickness of metal electrodes 150 and 170 and the piezoelectric layer 160 is beneficial for making high performance resonators with good temperature characteristics.

In addition to good temperature characteristics, it is important that the thickness overtone resonator 100 has a high quality factor, as also discussed above. This performance characteristic requires confining the vibrations 100 within the resonator and minimizing the energy leakage to the substrate 110. In FIGS. 3 and 4, for example, the thickness vibration mode (i.e., reference 180) is confined under in the area defined by the top electrode 170. In one exemplary aspect, the top electrode 170 can have a planar surface area (i.e., in the direction parallel to the X and Y axes directions) in the range from 2,500 μm² to 250,000 μm². Moreover, the top electrode 170 can be formed having an electrode width (i.e., in the X and Y axis directions) ranging from 50 μm to 500 μm.

In yet a further refinement of the example aspect, as shown in FIG. 4, the width of the cavity 120 (e.g., the diameter in the X axis direction) is larger than the corresponding width of the top electrode 170. In particular, outside the area of the top electrode 170, the vibration amplitude decays with the increasing distance from the edge 172 of the top electrode. As such, the resonator is configured such that the cavity 120 comprises a first width extending in a direction parallel to the principal surface of the cavity 120 and the top electrode 170 comprises a second width extending in the direction parallel to the principal surface of the cavity, with the second width being less than the first width.

Therefore, to minimize the energy loss and thus maximize the quality factor of the resonator 100, the cavity 120 is formed in the silicon substrate 110 with a larger width in the X and Y directions than a corresponding width in these directions of the surface area of the top electrode 170. Moreover, in an exemplary aspect, the distance between the electrode edge 172 and cavity edge 112 (e.g., extending in the X direction) should ideally be several wavelengths. For example, distances from the electrode edge 172 to the cavity edge 112 (in the X axis direction) can be between 10 μm and 100 μm. Moreover, the area defined by the cavity 120 (i.e., from the top view) is therefore 4,900 μm² to 490,000 μm². According to this configuration, the top electrode 170 comprises an area that is 80% or less of the resonator area over the cavity 120.

Figure 5:
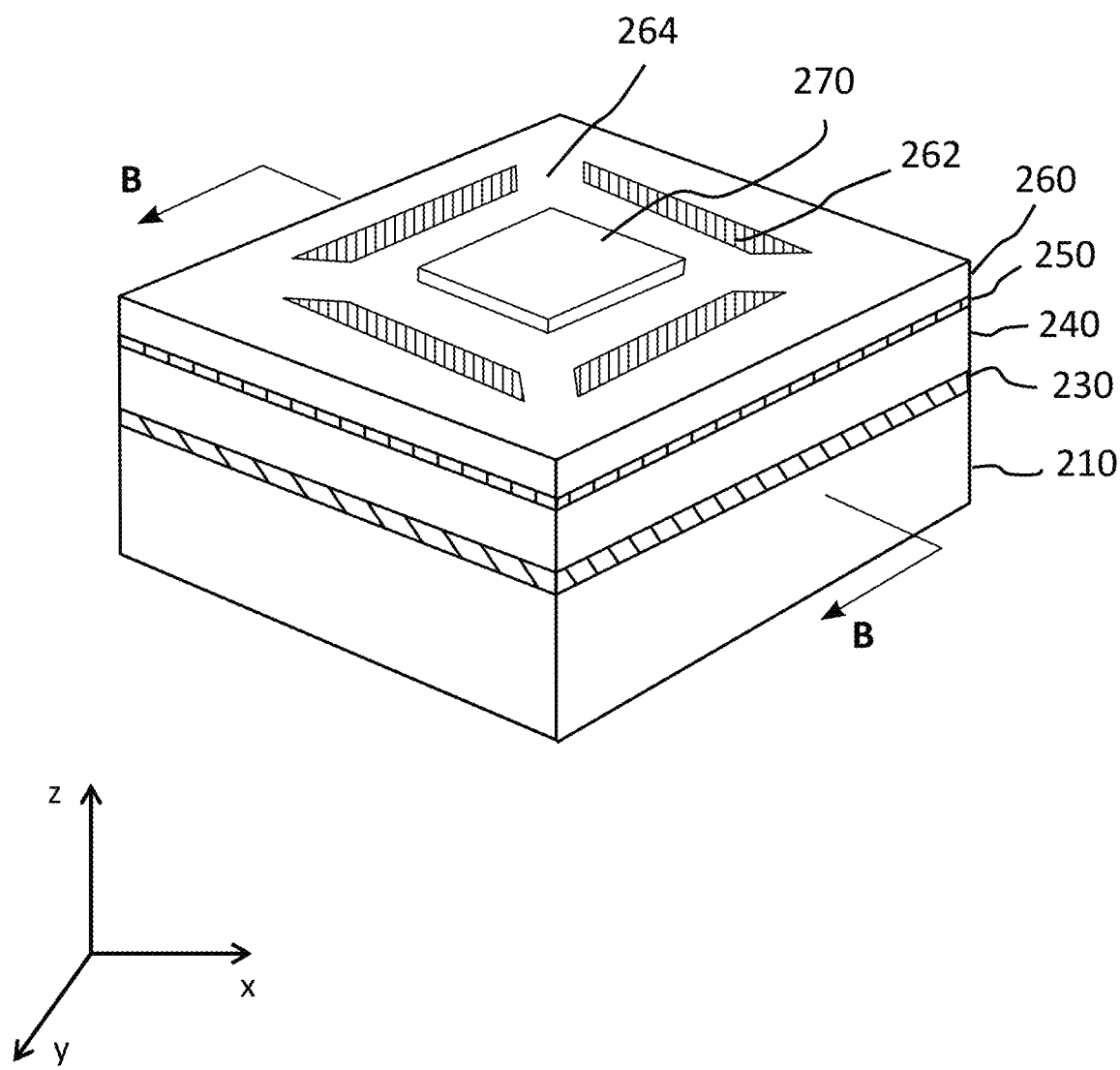
FIG. 5 illustrates a thickness mode overtone resonator according to a second exemplary embodiment.
Figure 6:
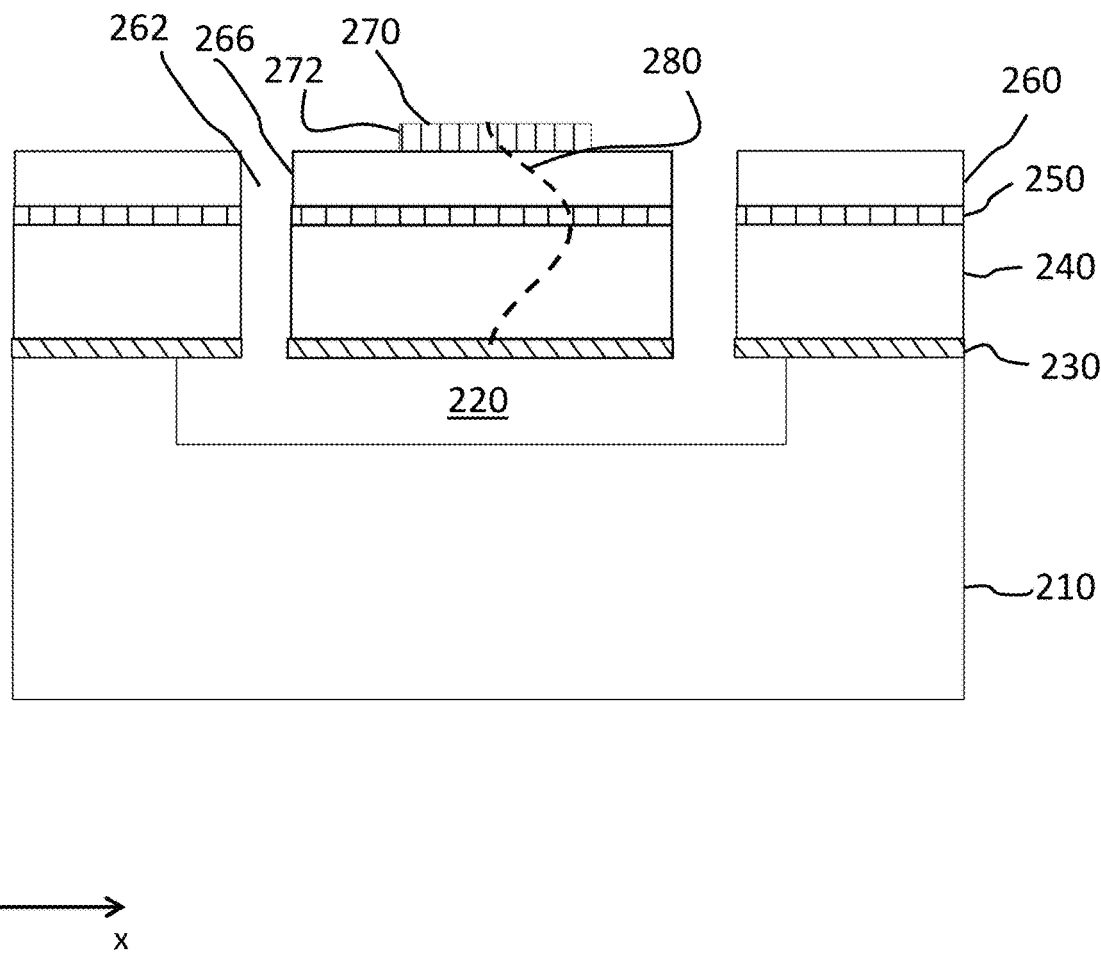
FIG. 6 illustrates a cross sectional view of the thickness mode overtone resonator taken along lines B-B as shown in FIG. 5 according to the second exemplary embodiment.

In another exemplary aspect, FIG. 5 illustrates a thickness mode overtone resonator according to a second exemplary embodiment. FIG. 6 illustrates a cross sectional view of the thickness mode overtone resonator taken along lines B-B as shown in FIG. 5 according to the second exemplary embodiment.

It is noted that the thickness mode overtone resonator 200 according to the second exemplary embodiment comprises many of the same components shown above in FIGS. 3 and 4. For example, the thickness mode overtone resonator 200 generally includes a silicon substrate 210, a silicon dioxide layer 230 formed on top of the silicon substrate 210, a single crystal silicon layer 240 disposed on top thereof, and a stacked configuration of the bottom electrode 250, the piezoelectric layer 260 and the top electrode 270 to form the vibrating resonator. Moreover, each of these components can be provided according the same configurations and same dimensions (e.g., thicknesses) as described above with respect to the components of the thickness mode overtone resonator 100 according to the first exemplary embodiment. Yet further, it is noted that the thickness mode overtone resonator 200 is configured to vibrate in the thickness mode, i.e., as shown by the dotted line 280.

In addition, according to the second exemplary embodiment, as shown in FIGS. 3 and 4, a plurality of etch trenches 262 extend through the silicon dioxide layer 230 and the silicon layer 240 (as well as vibrating resonator formed by electrodes 250 and 270 and piezoelectric layer 260), such that the plurality of etch trenches 262 extend to the cavity 220 formed in the silicon substrate 210. Advantageously, the plurality of etch trenches 262 are etched in the resonator 262 to further reduce energy loss and improve the quality factor. These etched grooves can be defined by etching through the thin films and the single crystal silicon 240. Moreover, to attach the resonator (i.e., electrodes 250 and 270 and piezoelectric layer 260) to the silicon substrate 210, corner connecting portions 264 around the resonator are not etched to effectively form one or more narrow anchors 264.

Thus, in a refinement of this exemplary aspect, even when the resonator energy loss is minimized with the etched trenches 262, preferably the distance from the side edge 272 of the top electrode 270 to the edge 266 (shown in FIG. 6) of the groove or trench 262 is multiple wavelengths and in the range from 10 μm to 100 μm. Moreover, in a similar configuration as described above, the area of the top electrode 270 (i.e., in the X and Y axis directions) is 80% or less of the resonator area surrounded by the etched trenches 262.

In one further refinement of the exemplary aspect, the top electrode 270 includes a surface shape (i.e., parallel to the X and Y axes directions) that is polygon shape (e.g., rectangular or square shaped). Moreover, it is contemplated that the plurality of etch trenches 262 can be disposed at are equal distances from the top electrode 270 as further shown in FIG. 5.

Figure 7:
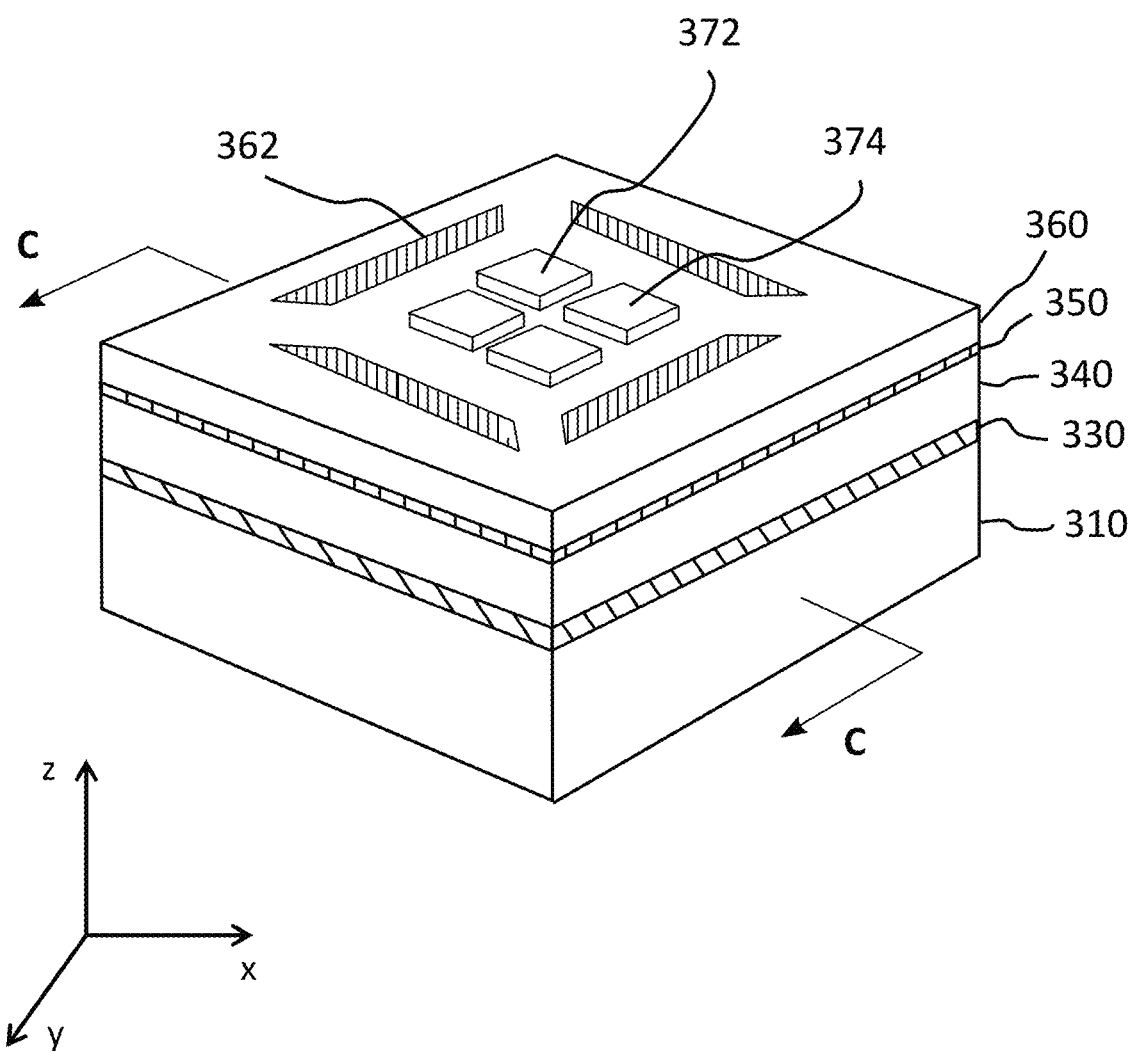
FIG. 7 illustrates a thickness mode overtone resonator according to a third exemplary embodiment.
Figure 8:
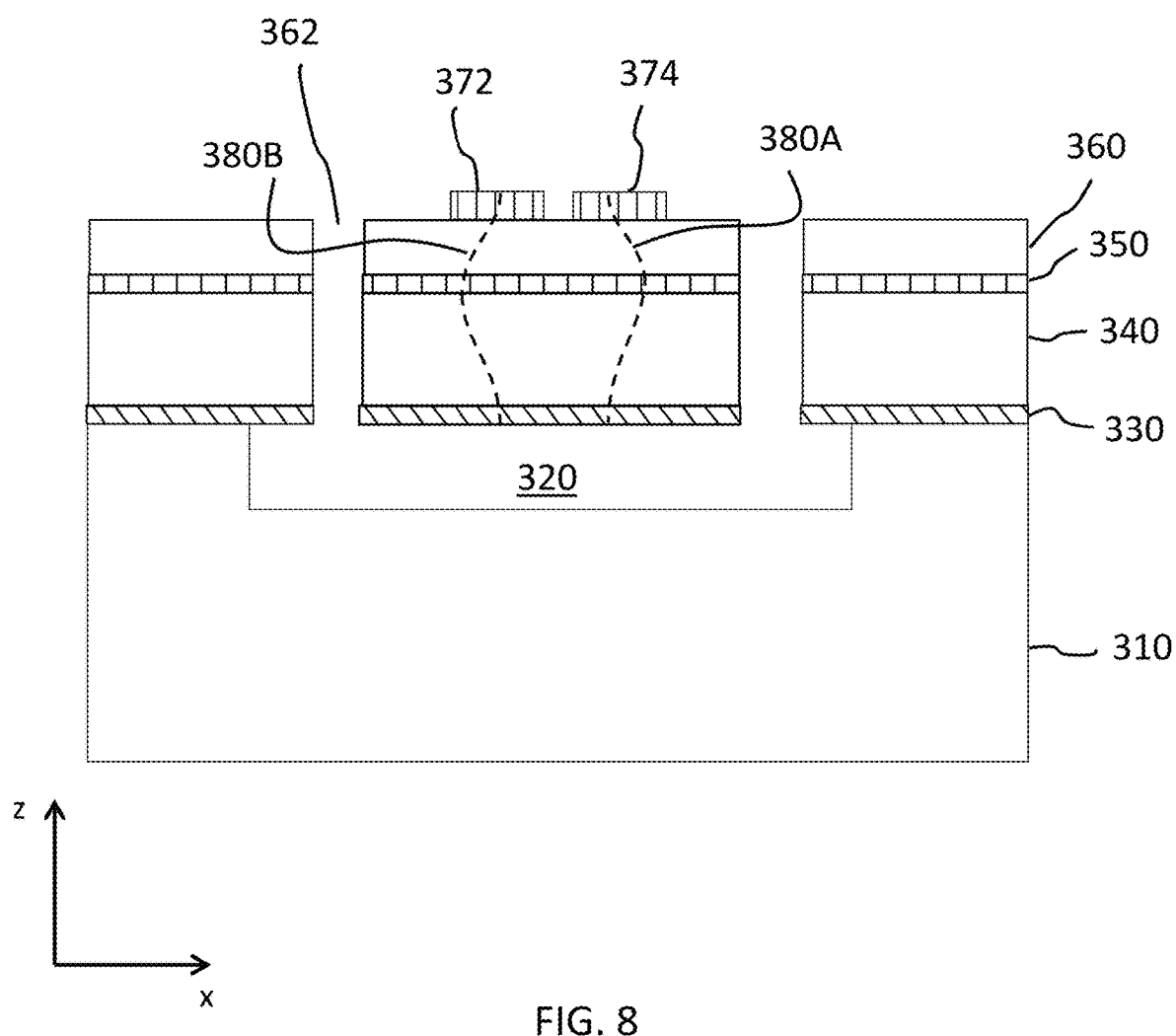
FIG. 8 illustrates a cross sectional view of the thickness mode overtone resonator taken along lines C-C as shown in FIG. 7 according to the third exemplary embodiment.

In another exemplary aspect, FIG. 7 illustrates a thickness mode overtone resonator 300 according to a third exemplary embodiment. FIG. 8 illustrates a cross sectional view of the thickness mode overtone resonator taken along lines C-C as shown in FIG. 7 according to the third exemplary embodiment.

It is noted that the thickness mode overtone resonator 300 according to the third exemplary embodiment comprises many of the same components shown above in first and second exemplary embodiments. For example, the thickness mode overtone resonator 300 generally includes a silicon substrate 310, a silicon dioxide layer 330 is formed on top of the silicon substrate 310, a single crystal silicon layer 340 disposed on top thereof, and a stacked configuration for the resonator including the bottom electrode 350, the piezoelectric layer 360 and the top electrode 370. Moreover, each of these components can be provided according the same configurations and same dimensions (e.g., thicknesses) as described above with respect to the components of the thickness mode overtone resonators 100 and 200 according to the first and second exemplary embodiments, respectively. Yet further, a plurality of etch trenches 362 extend through the silicon dioxide layer 330 and the silicon layer 340 (as well as bottom electrode 350 and piezoelectric layer 360), such that the plurality of etch trenches 362 extend to the cavity 320 formed in the silicon substrate 310.

In addition, as shown in FIG. 7, for example, the thickness mode overtone resonator 300 is configured to be implemented in applications where noise and vibration tolerance is required. As a result, it is beneficial that the resonator has differential input output to construct a differential oscillator. Thus, according to the exemplary embodiment, the thickness mode overtone resonator 300 includes a top electrode that is segmented into two or more areas 372 and 374 (i.e., segmented top electrode portions). As further shown in FIG. 8, under corresponding areas 372 and 374, the vibration mode is 180 degrees out of phase as is illustrated by the dotted mode shape lines 380A and 380B. Accordingly, to form a differential oscillator, the bottom electrode 350 can be grounded and the signal output may be measured differentially between the two top electrodes components/areas 372 and 374. It should again be appreciated that the thickness mode overtone resonator 300 is configured to vibrate in the thickness mode when implemented as a differential oscillator.

In the interest of clarity, not all of the routine features of the embodiments are disclosed herein. It should be appreciated that in the development of any actual implementation of the present disclosure, numerous implementation-specific decisions must be made in order to achieve the designer's specific goals, and these specific goals will vary for different implementations and different designers. It is understood that such a design effort might be complex and time-consuming, but would nevertheless be a routine undertaking of engineering for those of ordinary skill in the art, having the benefit of this disclosure.

Furthermore, it is to be understood that the phraseology or terminology used herein is for the purpose of description and not of restriction, such that the terminology or phraseology of the present specification is to be interpreted by those skilled in the art in light of the teachings and guidance presented herein, in combination with the knowledge of the skilled in the relevant art(s). Moreover, it is not intended for any term in the specification or claims to be ascribed an uncommon or special meaning unless explicitly set forth as such.

While the foregoing has been described in conjunction with exemplary embodiments, it is understood that the term "exemplary" is merely meant as an example. Accordingly, the application is intended to cover alternatives, modifications and equivalents, which may be included within the spirit and scope of the thickness mode resonator disclosed herein.

REFERENCE SIGNS LIST 100, 200, 300: thickness mode overtone resonator
110, 210, 310: silicon substrate
112: silicon substrate side
120, 220, 320: cavity
130, 230, 330, 190B, 109C: silicon dioxide layer
140, 240, 340: single crystal silicon layer
150, 250, 350: bottom electrode
160, 260, 360: piezoelectric layer
262, 362: etch trenches
264: corner connecting portion
170, 270: top electrode
172: electrode edge
180, 280, 380A, 380B: vibration modes
372, 374: segmented top electrode areas

What is claimed:

1. A resonator configured to vibrate in a thickness direction, the resonator comprising:
    a substrate having a cavity extending in a principal surface thereof;
    a piezoelectric film stack disposed above the principal surface of the substrate and including bottom and top electrodes with a piezoelectric layer disposed therebetween, with the piezoelectric film stack comprising a thickness that substantially corresponds to a half wavelength $\lambda/2$ of the resonator;
    a positive temperature coefficient stack that includes at least a silicon layer and that is disposed between the substrate and the piezoelectric film stack to cover the cavity of the substrate, with the positive temperature coefficient stack comprising a thickness that substantially corresponds to a multiple of the half wavelength $\lambda/2$ of the resonator;
    wherein the piezoelectric film stack comprises a negative temperature coefficient,
    wherein the silicon layer is doped to configure the positive temperature coefficient stack to have a positive temperature coefficient, such that the positive temperature coefficient stack combined with the piezoelectric film stack configures the resonator as a zero temperature coefficient overtone resonator that vibrates in the thickness direction, and
    wherein the thickness of the silicon layer comprises one of a wavelength of $\lambda/2$, $\lambda$, $3\lambda/2$ or $2\lambda$ of the resonator, such that the resonator is configured as a thickness mode overtone resonator.

2. The resonator according to claim 1, further comprising a plurality of etch trenches that extend through the bottom electrode and the piezoelectric layer of the piezoelectric film stack and through the positive temperature coefficient stack, such that the plurality of etch trenches extend to the cavity of the substrate.

3. The resonator according to claim 2, wherein the top electrode comprises a surface area such that the plurality of etch trenches are each disposed an equal distance from the top electrode.

4. The resonator according to claim 3, wherein the top electrode comprises a surface area such that the plurality of etch trenches are each at distance between 10 to 100 µm from top electrode.

5. The resonator according to claim 1, wherein the cavity comprises a first width extending in a direction parallel to the principal surface of the cavity and the top electrode comprises a second width extending in the direction parallel to the principal surface of the cavity, with the second width being less than the first width.

6. The resonator according to claim 5, wherein the second width of the top electrode is between 50 µm and 500 µm.

7. The resonator according to claim 1, wherein the top electrode comprises a surface area that is 80% or less than a projection of a cavity area on which the top electrode is disposed.

8. The resonator according to claim 7, wherein a distance between the top electrode and an edge of the cavity in a widthwise direction of the resonator is between 10 to 100 µm from top electrode.

9. The resonator according to claim 1, wherein the positive temperature coefficient stack further comprises at least one silicon dioxide layer disposed between the silicon layer and the piezoelectric film stack.

10. The resonator according to claim 1, wherein the piezoelectric film stack further comprises at least one silicon dioxide layer disposed between the bottom and top electrode layers.

11. The resonator according to claim 1, wherein the silicon layer is doped with phosphorous to configure the positive temperature coefficient stack to have the positive temperature coefficient balanced with the negative temperature coefficient of the piezoelectric film stack.

12. The resonator according to claim 1, wherein the top electrode comprises a plurality of segmented top electrodes and the bottom electrode is grounded, such that the resonator is configured as a differential oscillator with at least two of the plurality of segmented top electrodes configuring adjacent areas of the differential oscillator to vibrate 180 degrees out of phase from one another.

13. A resonator configured to vibrate in a thickness direction, the resonator comprising:
a substrate having a cavity extending in a principal surface thereof;
a piezoelectric resonator disposed above the principal surface of the substrate, with the piezoelectric resonator including bottom and top electrodes with a piezoelectric layer disposed therebetween;
a positive temperature coefficient resonator disposed between the substrate and the piezoelectric resonator to cover the cavity of the substrate, with positive temperature coefficient resonator including at least a silicon layer doped to configure the positive temperature coefficient resonator to have a positive temperature coefficient,
wherein the cavity comprises a first width extending in a direction parallel to the principal surface of the cavity and the top electrode comprises a second width extending in the direction parallel to the principal surface of the cavity, with the second width being less than the first width, wherein the silicon layer has a thickness that comprises one of a wavelength of $\lambda/2$, $\lambda$, $3\lambda/2$ or $2\lambda$ of the resonator, such that the resonator is configured as a thickness mode overtone resonator.

14. The resonator according to claim 13, further comprising a plurality of etch trenches that extend through the bottom electrode and the piezoelectric layer of the piezoelectric resonator and through the positive temperature coefficient resonator, such that the plurality of etch trenches extend to the cavity of the substrate.

15. The resonator according to claim 13, wherein the piezoelectric resonator comprises a negative temperature coefficient, and the silicon layer is doped with phosphorous to balance the positive temperature coefficient resonator with the piezoelectric resonator, such that the resonator is configured as a zero temperature coefficient overtone resonator that vibrates in the thickness direction.

16. The resonator according to claim 15,
wherein the piezoelectric resonator comprises a thickness that substantially corresponds to a half wavelength $\lambda/2$ of the resonator; and
wherein the positive temperature coefficient resonator comprises a thickness that substantially corresponds to a multiple of the half wavelength $\lambda/2$ of the resonator.

17. The resonator according to claim 13, wherein at least one silicon dioxide layer is disposed between at least the silicon layer and the piezoelectric resonator or between the bottom and top electrode layers.

18. A resonator configured to vibrate in a thickness direction, the resonator comprising:
a substrate having a cavity extending in a principal surface thereof;
a piezoelectric film stack disposed above the principal surface of the substrate and including bottom and top electrodes with a piezoelectric layer disposed therebetween, with the piezoelectric film stack comprising a thickness that substantially corresponds to a half wavelength $\lambda/2$ of the resonator;
a positive temperature coefficient stack that includes at least a silicon layer and that is disposed between the substrate and the piezoelectric film stack to cover the cavity of the substrate, with the positive temperature coefficient stack comprising a thickness that substantially corresponds to a multiple of the half wavelength $\lambda/2$ of the resonator;
wherein the piezoelectric film stack comprises a negative temperature coefficient,
wherein the silicon layer is doped to configure the positive temperature coefficient stack to have a positive temperature coefficient, such that the positive temperature coefficient stack combined with the piezoelectric film stack configures the resonator as a zero temperature coefficient overtone resonator that vibrates in the thickness direction,
wherein the silicon layer is doped with phosphorous to configure the positive temperature coefficient stack to have the positive temperature coefficient balanced with the negative temperature coefficient of the piezoelectric film stack, and
wherein a resistivity of the phosphorus doped silicon layer is equal to or less than 0.8 mΩ·cm.

* * * * *